United States Patent [19]

Röthlingshöfer et al.

[11] Patent Number: 5,355,280

[45] Date of Patent: Oct. 11, 1994

[54] CONNECTION ARRANGEMENT WITH PC BOARD

[75] Inventors: Walter Röthlingshöfer; Ulrich Goebel; Roland Gerstner, all of Reutlingen, Fed. Rep. of Germany

[73] Assignee: Robert Bosch GmbH, Stuttgart, Fed. Rep. of Germany

[21] Appl. No.: 133,529

[22] Filed: Oct. 7, 1993

Related U.S. Application Data

[63] Continuation of Ser. No. 776,269, Nov. 27, 1991, abandoned.

[30] Foreign Application Priority Data

Sep. 27, 1989 [DE] Fed. Rep. of Germany ....... 3932213

[51] Int. Cl.$^5$ ................................................ H05K 7/20
[52] U.S. Cl. ..................................... 361/705; 174/252; 257/713; 361/719; 428/901
[58] Field of Search ................. 156/901, 902; 428/901; 165/80.3, 185; 439/485; 174/252, 259; 257/705–707, 713; 361/690, 704, 705, 706, 707–709, 720, 722, 792, 718, 719

[56] References Cited

U.S. PATENT DOCUMENTS

| | | | |
|---|---|---|---|
| 4,383,270 | 5/1983 | Schelhorn | 357/71 |
| 4,546,410 | 10/1985 | Kaufman | 361/387 |
| 4,709,301 | 11/1987 | Yamaguti | 361/705 |
| 4,771,365 | 9/1988 | Cichocki | 361/705 |
| 4,796,157 | 1/1989 | Ostrem | 361/386 |
| 4,802,532 | 2/1989 | Dawes et al. | 165/80.3 |
| 4,847,146 | 7/1989 | Yeh | 428/332 |
| 4,897,764 | 1/1990 | Bruchmann | 361/387 |
| 4,979,079 | 12/1990 | Morley | 361/387 |
| 5,117,069 | 5/1992 | Higgins, III | 174/261 |
| 5,164,541 | 11/1992 | Leysseus | 174/15.2 |

FOREIGN PATENT DOCUMENTS

| | | | |
|---|---|---|---|
| 2579060 | 9/1986 | France | 361/386 |
| 2135521 | 8/1984 | United Kingdom . | |

OTHER PUBLICATIONS

"On–Board ... Printhead", Mizzi, vol. 24, No. 1A, Jun. 1981, p. 284, IBM Tech Discl. Bull.

Primary Examiner—Gerald P. Tolin
Attorney, Agent, or Firm—Frishauf, Holtz, Goodman & Woodward

[57] ABSTRACT

A connection arrangement with PC board features a ceramic substrate glued to a base plate of metal, used as a cooling body. Islands have been hollowed out of the adhesive layer and are filled with thermally conductive paste. Particularly effective thermal dissipation is possible in the area of the islands filled with thermally conductive paste, so that the islands are always disposed underneath components with great energy or heat dissipation.

6 Claims, 1 Drawing Sheet

CONNECTION ARRANGEMENT WITH PC BOARD

This application is a continuation, of application Ser. No. 07/776,269, filed Nov. 27, 1991, now abandoned.

FIELD OF THE INVENTION

The invention relates to a connection arrangement with PC board.

BACKGROUND

So that the energy dissipated by electrical components on a PC board can be conducted away as best as possible, PC boards are glued flat on a cooling body by means of a suitable adhesive. In this case the PC boards can consist of a ceramic substrate and have a surface of for example 6×4 inches. The cooling body located underneath the PC board may consist of an aluminum plate or the like, which is adapted to the surface of the glued-on ceramic PC board.

In these connection arrangements there is, on the one hand, a requirement for the adhesive to be sufficiently resilient so that it can even out the different degrees of thermal expansion of the ceramic substrate and the aluminum plate by its resilience. On the other hand, however, the adhesive should nave the best possible thermal conductivity, so that the heat given off by the structural components (energy dissipation) can be conducted away to the aluminum plate in the best possible way, so that the respective electric components do not heat up too much. To give the adhesive improved thermal conductivity, it is possible to admix with it, for example, metal particles, ceramic particles or other materials with a high degree of thermal conductivity. However, the resilience of the adhesive is reduced in the same degree as the amount of thermally-conductive particles present in the adhesive is increased. This results in requiring the adhesive layer to be thicker than that of a highly resilient adhesive which, however, shows very poor thermal conductivity. But the thicker adhesive layers of the loaded adhesives counteract good thermal conductivity. Furthermore, the adhesives enriched with thermally conductive particles have noticeably less adhesiveness than adhesives which have not been "loaded".

THE INVENTION

In contrast thereto, a connection arrangement has the advantage that optimal thermal dissipation to the cooling body via the thermally conductive paste is assured in exactly those locations where high energy dissipation and heat occurs. The remaining areas, where no noticeable heating occurs, are connected with the base plate used as cooling body via a highly resilient adhesive layer, where a thin coating of the highly resilient adhesive is sufficient to take care of the different thermal expansion coefficients of the PC board and base plate. The resilient adhesive has good adhesive qualities, so that there is also a good mechanical connection between the PC board and the base plate. Furthermore, the thin adhesive layer results in the islands with thermally conductive paste having a correspondingly lesser layer thickness and in this way improves the heat dissipation to the cooling body disposed below them in the area of the heat generating components.

The islands are preferably composed of thermally conductive paste; however, other materials can be used for special application cases. For example, an adhesive enriched with thermally conductive particles could be used, the thermal conductivity of which is considerably greater than that of the remaining adhesive layer.

The arrangement of islands with a high degree of thermal conductivity is particularly advantageous in connection with thick film integrated circuits on a ceramic substrate glued to a metallic cooling body. The very different thermal expansion coefficients of the ceramic substrate and, for example, a cooling body of aluminum can be easily taken into account by means of the embodiment in accordance with the invention of the intermediate layer.

It can be very advantageous, particularly in connection with large-scale connection arrangements, to dispose spacer elements distributed over the surface between the PC board and the base plate. Blobs of adhesive, glass balls or the like can be used as spacer elements in this case. The spacer elements have the advantage that the PC board can be pushed down under pressure during the gluing operation and that a uniform distance between the PC board and the base plate is assured in this manner. Defined conditions are achieved in this way, i.e. the intermediate layer having uniform thickness over the entire surface.

To produce the connection arrangement, the adhesive layer with its island-shaped recesses can be applied by means of the screen printing process or pin transfer process. The pin transfer process uses a plurality of transfer pins disposed closely next to each other which, for the transfer process, are first dipped into the adhesive and are then placed on the surfaces of the base plate to which adhesive is to be applied.

BRIEF FIGURE DESCRIPTION

The invention will now be described in detail, with reference to the accompanying drawings, of which:

FIG. 1 is a cross-sectional view of the metal heat sink, adhesive layer, and ceramic PC board structure of the present invention; and FIG. 2 is a top view of the PC board and chips mounted thereon, indicating at I I the section line for the FIG. 1 view, and showing, by dashed lines, the outline of islands of thermally conductive paste underneath major heat-generating chips.

DETAILED DESCRIPTION

Figure 1:
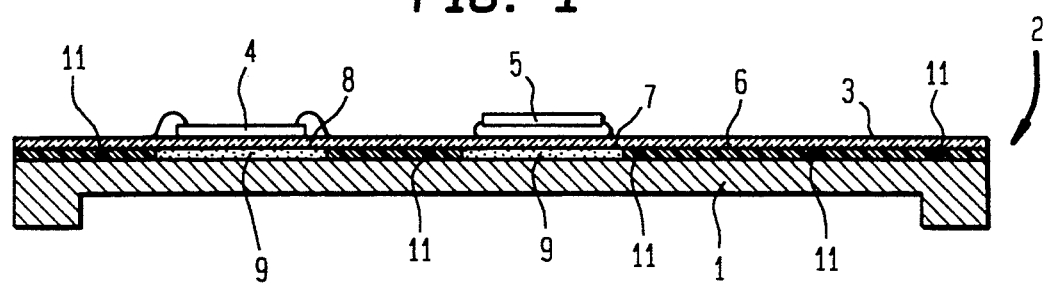

The connection arrangement shown in FIG. 1 consists of a base plate 1, used as a cooling body, an intermediate layer 2 and a PC board 3, on the top surface of which electrical components 4, 5 with heavy energy dissipation, and components 12, 13 with low energy dissipation are disposed. In the exemplary embodiment the base plate 1 is made of aluminum, while the PC board 3 is a ceramic substrate. Strip conductors, not visible in this case, are applied to the top surface of the ceramic substrate and electrically connect the components 4, 5, 12, 13.

The intermediate layer 2 consists of an adhesive layer 6 and the islands 7, 8 made of thermally conducting paste 9.

Figure 2:
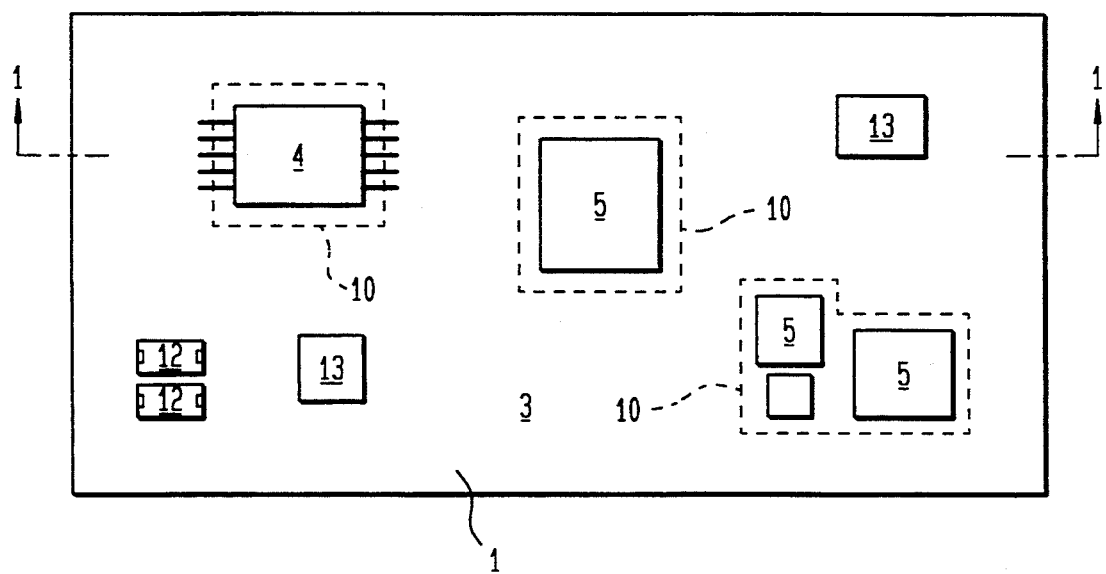

The surface of the islands 7, 8 is drawn in FIG. 2 with dashed lines 10. This makes it clear that the surfaces of the islands 7, 8 are dimensioned surface of the components 4, 5 located above them. The slightly enlarged surface of the islands 7, 8 results in an improvement of heat dissipation towards the base plate 1.

The components can be fastened to the PC board by means of arbitrary assembly techniques in wrapped or unwrapped structural form, for example, chip and wire, PLCC, TO, flip chip, etc.

During hardening of the adhesive layer 6 (FIG. 1), the PC board 3 can be pressed on the adhesive layer 6. Spacer elements 11, distributed over the surface, are disposed in the adhesive layer, which are embodied as previously applied and hardened blobs of adhesive. However, it is also possible to use suitable small glass balls or like spacer elements for this. By pressing the PC board 3 down on the spacer elements 11 it is assured that the intermediate layer 2 has a uniform thickness over the entire surface.

We claim:

1. Connection arrangement, comprising
a PC board ( 3 ) and, mounted thereon, at least one energy-dissipating electrical component (4, 5);
a base plate (1) adhered to one major surface of said PC board and serving as a cooling body, said base plate (1) having a thermal expansion coefficient different from that of the PC board (3), and
a layer (6) of adhesive located between the PC board (3) and the base plate (1), said layer having sufficient resiliency to maintain adhesion to both said PC board and said base plate despite different thermal expansions of said base plate (1) and of said PC board (3), and including a plurality of islands (7, 8) of thermally conducting paste, having thermal dissipation capacity greater than that of other portions of said layer (6), each island being arranged between said cooling body and said at least one energy-dissipating electrical component (4, 5).

2. A connection arrangement in accordance with claim 1, characterized in that
the PC board (3) consists of a ceramic substrate with electrically conducting and insulating structures and
the base plate (1) is made of aluminum, and that
said PC board and said base plate are mechanically connected by means of said adhesive layer (6), which is highly resilient.

3. A connection arrangement in accordance with claim 1, characterized in that
the PC board (3) is formed as a ceramic substrate with thick film integrated circuits, to which semiconductors are secured as said at least one energy-dissipating component (4, 5).

4. A connection arrangement in accordance with claim 1, characterized in that
spacer elements (11), arranged at regular intervals on a major surface of said board, are disposed between the PC board (3) and the base plate (1).

5. A connection arrangement in accordance with claim 4, characterized in that
the spacer elements (11) are hardened blobs of said adhesive.

6. A connection arrangement in accordance with claim 3, characterized in that
the PC board (3) consists of a ceramic substrate with electrically conducting and insulating structures and
the base plate (1) is made of aluminum, and that
said PC board and said base plate are mechanically connected by means of said adhesive layer (6), which is highly resilient.

* * * * *